(12) United States Patent  
Chen et al.

(10) Patent No.: US 11,214,868 B2
(45) Date of Patent: Jan. 4, 2022

(54) CHEMICAL VAPOR DEPOSITION APPARATUS AND BLOCKER PLATE

(71) Applicant: TAIWAN SEMICONDUCTOR MANUFACTURING COMPANY LTD., Hsinchu (TW)

(72) Inventors: Huan-Chieh Chen, Taichung (TW); Chao-Chun Wang, Hsinchu (TW); Chih-Yu Wu, Hsinchu (TW); Keith Kuang-Kuo Koai, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 49 days.

(21) Appl. No.: 16/455,172

(22) Filed: Jun. 27, 2019

(65) Prior Publication Data

US 2020/0131640 A1   Apr. 30, 2020

Related U.S. Application Data

(60) Provisional application No. 62/753,336, filed on Oct. 31, 2018.

(51) Int. Cl.
*C23C 16/40* (2006.01)
*C23C 16/455* (2006.01)

(52) U.S. Cl.
CPC ............................. *C23C 16/45591* (2013.01)

(58) Field of Classification Search
CPC .................... C23C 16/45591; C23C 16/45565
USPC .................... 118/715; 156/345.33, 345.34
See application file for complete search history.

(56) References Cited

U.S. PATENT DOCUMENTS

| | | | |
|---|---|---|---|
| 6,050,506 A * | 4/2000 | Guo ................ | C23C 16/45565 239/558 |
| 10,062,585 B2 * | 8/2018 | Lubomirsky ..... | H01L 21/67069 |
| 2005/0255257 A1 * | 11/2005 | Choi .................. | H01L 21/0217 427/585 |
| 2015/0247237 A1 * | 9/2015 | Ha ...................... | C23C 16/4401 118/715 |
| 2017/0167024 A1 * | 6/2017 | Wiltse .............. | C23C 16/45574 |

* cited by examiner

*Primary Examiner* — Rudy Zervigon
(74) *Attorney, Agent, or Firm* — WPAT, P.C., Intellectual Property Attorneys; Anthony King

(57) ABSTRACT

The present disclosure provides a blocker plate, including a plate body having a plurality of through holes, a first zone from a center to a first radius of the plate body, having a first conductance, a second zone from the first radius to a second radius of the plate body, having a second conductance, a third zone from the second radius to a third radius of the plate body, having a third conductance, wherein the first radius is smaller than the second radius, the second radius is smaller than the third radius, and the second conductance is greater than the first conductance. A chemical vapor deposition (CVD) apparatus including the blocker plate is also disclosed.

20 Claims, 13 Drawing Sheets

CHEMICAL VAPOR DEPOSITION APPARATUS AND BLOCKER PLATE

CROSS REFERENCE TO RELATED APPLICATIONS

This application claims the benefit of prior-filed provisional application No. 62/753,336, filed Oct. 31, 2018, which is incorporated by reference in its entirety.

BACKGROUND

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

In the semiconductor production industry, various processing steps are used to fabricate integrated circuits on a semiconductor wafer. These steps include the deposition of layers of different materials including metallization layers, passivation layers and insulation layers on the wafer substrate, as well as photoresist stripping and sidewall passivation polymer layer removal. In modern memory devices, for example, multiple layers of metal conductors are required for providing a multi-layer metal interconnection structure in defining a circuit on the wafer. A current drive in the semiconductor device industry is to produce semiconductors having an increasingly large density of integrated circuits which are ever-decreasing in size. These goals are achieved by scaling down the size of the circuit features in both the lateral and vertical dimensions. Vertical downscaling requires that the thickness of conductive and insulative films on the wafer be reduced by a degree which corresponds to shrinkage of the circuit features in the lateral dimension. Ultrathin device features will become increasingly essential for the fabrication of semiconductor integrated circuits in the burgeoning small/fast device technology.

Chemical vapor deposition (CVD) processes are widely used to form layers of materials on a semiconductor wafer. CVD processes include thermal deposition processes, in which a gas is reacted with the heated surface of a semiconductor wafer substrate, as well as plasma-enhanced CVD processes, in which a gas is subjected to electromagnetic energy in order to transform the gas into more reactive plasma. Forming plasma can lower the temperature required to deposit a layer on the wafer substrate, to increase the rate of layer deposition, or both. Other CVD processes include APCVD (atmospheric pressure chemical vapor deposition), and LPCVD (low pressure chemical vapor deposition). While APCVD systems have high equipment throughput, good uniformity and the capability to process large-diameter wafers, APCVD systems consume large quantities of process gas and often exhibit poor step coverage. Currently, LPCVD is used more often than APCVD because of its lower cost, higher production throughput and superior film properties. LPCVD is commonly used to deposit nitride, TEOS oxide and polysilicon films on wafer surfaces for front-end-of-line (FEOL) processes

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
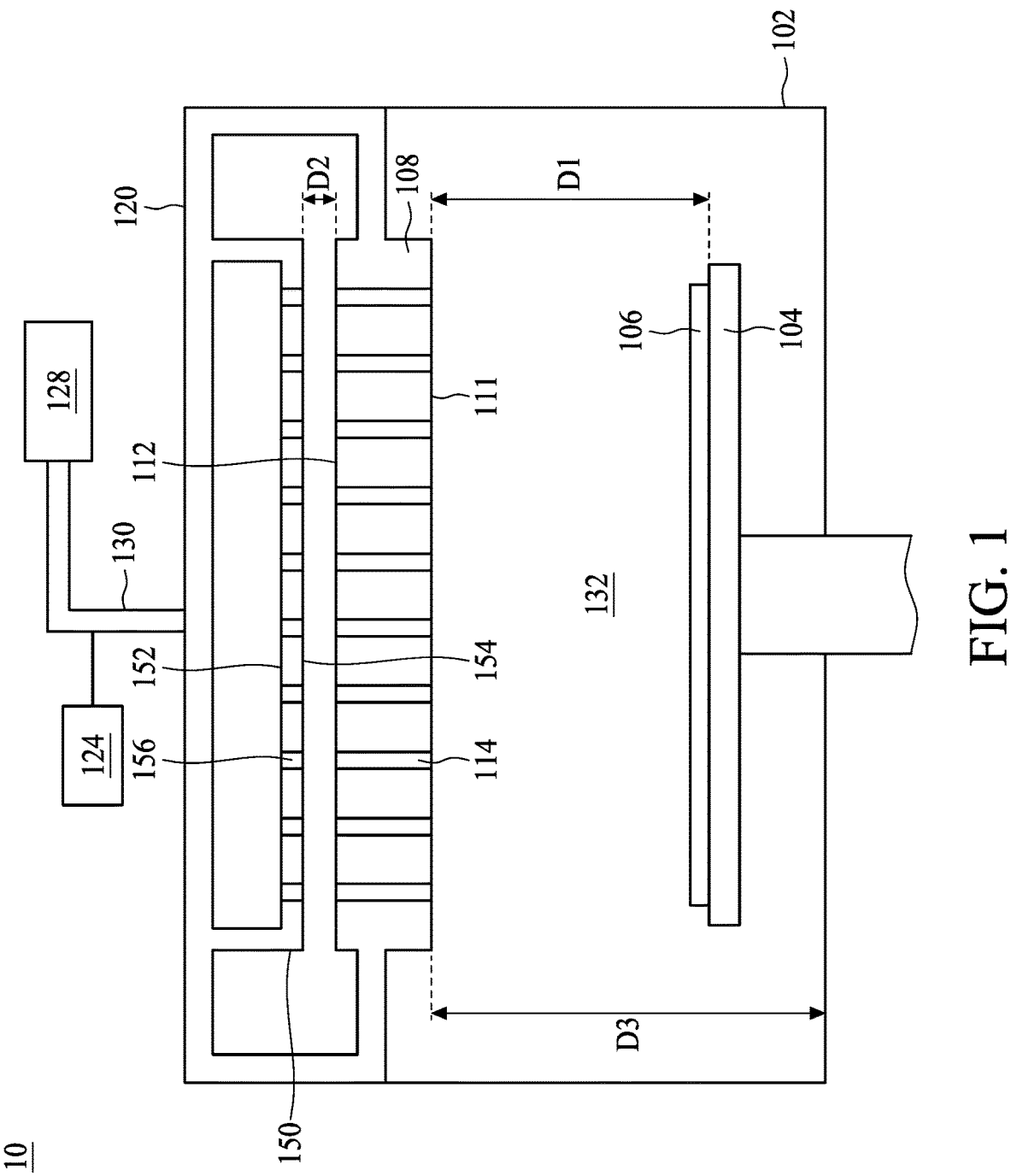
FIG. 1 is a cross section of a chemical vapor deposition (CVD) apparatus, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Same numerical label indicates substantially identical components or values and the definition of which will be omitted.

In a chemical vapor deposition (CVD) apparatus, a blocker plate is introduced between a process gas inlet and a showerhead in order to redistribute the gas flow before it reaches a substrate surface. Consistent and uniform film deposition over a large area substrate is difficult. In particular, differences in the flow and pressure of the process gas across an upstream surface of the gas distribution showerhead contribute to the difficulty in depositing a uniform film. Therefore, one or more blocker plates may be added between a backing plate and the showerhead to alter the flow and pressure differential of process gas as needed to provide the desired film deposition across the surface of the substrate.

The blocker plate is a circular plate having a plurality of through holes configured to redistribute the process gas. The arrangement of such through holes, in current practice, may constitute a constant hole density across the blocker plate. For example, the number of through holes per unit area at a center of the blocker plate is essentially the same as the number of through holes per unit area at an edge of the blocker plate. In other cases, the arrangement of the through holes may have a higher hole density at a center of the blocker plate and a lower hole density at an edge of the blocker plate, given the diameter of each through hole is essentially the same. Current though hole arrangement may not effectively achieve desired film thickness uniformity across the substrate. In some cases, the film thickness demonstrates a thinner portion at the center of the substrate and a thicker portion at the edge of the substrate, or even having a thickness drop at a certain radial distance from the center of the substrate.

Present disclosure provides a blocker plate design including non-uniform conductance distribution in a radial direction through particular arrangements of through holes that effective improve thickness uniformity of the film deposited over the substrate. Should the thickness uniformity is improved, subsequent etching operations would also be simplified since the film thickness at substrate center is close to that at substrate edge and less alternation of etching recipe is required.

Figure 11:
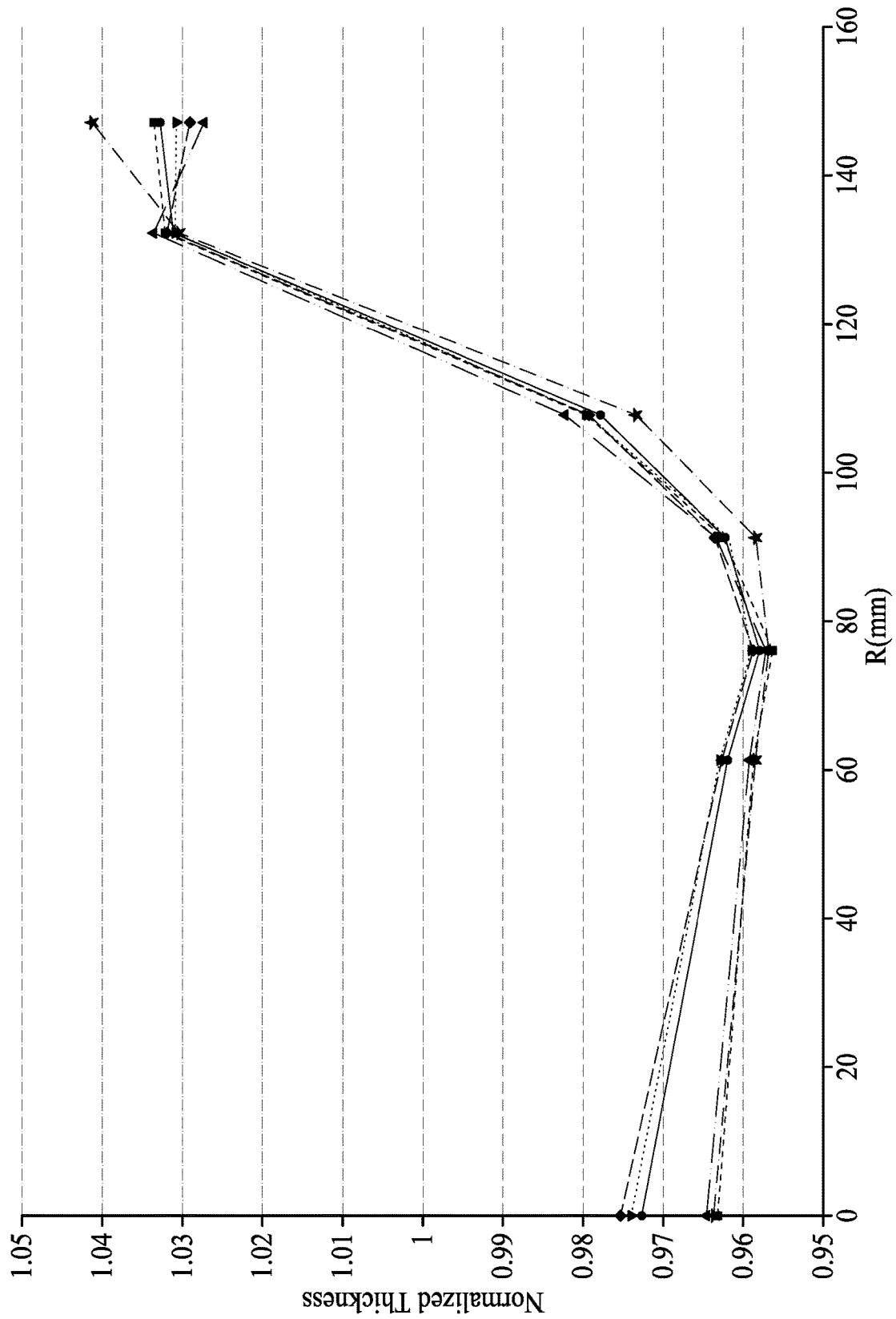
FIG. 11 is a diagram showing film thickness corresponding to different radial positions on a semiconductor wafer, in accordance with some comparative embodiments of the present disclosure.

Referring to FIG. 11, FIG. 11 is a diagram showing normalized film thickness (Y axis) corresponding to different radial positions on a semiconductor wafer (X axis), in accordance with some comparative embodiments of the present disclosure. Six sets of data are plotted in FIG. 11, all showing a non-uniform film thickness across the semiconductor wafer. It is shown that in the conventional blocker plate, film thickness varies drastically across the first zone (e.g., from semiconductor wafer center to a first radius of about 60 mm), the second zone (e.g., from a first radius of about 60 mm to a second radius of about 100 mm), and a third zone (e.g., from a second radius of about 100 mm to a third radius of about 160 mm). Solid lines connecting data points show that the deposited film has a thinnest portion between 70 mm and 80 mm and a thickest portion proximal to wafer edge (e.g., between 130 mm and 150 mm). The non-uniformity of the film thickness could lead to overetch at the aforesaid thinnest portion and underetch at the aforesaid thickest portion. Etching recipe adjustment only provides limited improvement to mitigate the overetch and underetch result. An alternative approach to obtain uniform film thickness across the wafer is therefore of primary importance.

Referring to FIG. 1, FIG. 1 is a cross section of a chemical vapor deposition (CVD) apparatus 10, in accordance with some embodiments of the present disclosure. The apparatus 10 includes a chamber body 102 enclosing a susceptor 104 for holding a substrate 106 thereon. The substrate 106 may comprise a semiconductor, a glass, or polymer substrate such as for integrated circuit manufacturing, solar panel manufacturing, flat panel display manufacturing, organic light emitting display manufacturing, or the like. The substrate 106 may rest on the susceptor 104 in the chamber body 102 across a processing region 132 from a gas distribution showerhead 108.

The gas distribution showerhead 108 may be coupled to a backing plate 120 by a suspension 118. The gas distribution showerhead 108 may have a downstream surface 111 that faces the processing region 132 and the substrate 106. The gas distribution showerhead 108 may also have an upstream surface 112 disposed opposite the downstream surface 111. A plurality of gas passages or through holes 114 extend through the gas distribution showerhead 108 from the upstream surface 112 to the downstream surface 111.

Process gas may be introduced into the process chamber 102 from a gas source 128. The process gas travels from the first gas source 128 through a central region of the backing plate 120 via a gas tube 130. In one embodiment, a showerhead 108 is coupled to a backing plate 120 with a blocker plate 150 disposed therebetween. In one embodiment, the blocker plate 150 has an upstream side 152 facing the backing plate 120 and a downstream side 154 facing the showerhead 108. In one embodiment, the blocker plate 150 has a plurality of gas passages 156 formed therethrough between the upstream side 152 and the downstream side 154. The process gas then diffuses through the gas distribution showerhead 108 into the processing region 132.

An RF power source 124 may be coupled to the process chamber 102 at the gas tube 130. When RF power is used, the RF current may travel along the backing plate 120, the suspension 118, and the downstream surface 111 of the gas distribution showerhead 108, where it ignites the process gas into plasma in the processing region 132.

In some embodiments, a first distance D1 in the CVD apparatus 10 can be defined as a separation between the shower head 108 and the susceptor 104, a second distance D2 in the CVD apparatus 10 can be defined as a separation between the blocker plate 150 and the shower head 108, and a third distance D3 in the CVD apparatus 10 can be defined as a separation between the shower head 108 and a bottom of the process chamber 102. In some embodiments, when the CVD apparatus 10 is utilized to deposit low-k dielectric materials, a ratio of the first distance to the third distance (D1/D3) is in a range of from about 8.5% to 10%, and a ratio of the first distance to the second distance (D1/D2) is in a range of from about 6 to 8.5.

Figure 2:
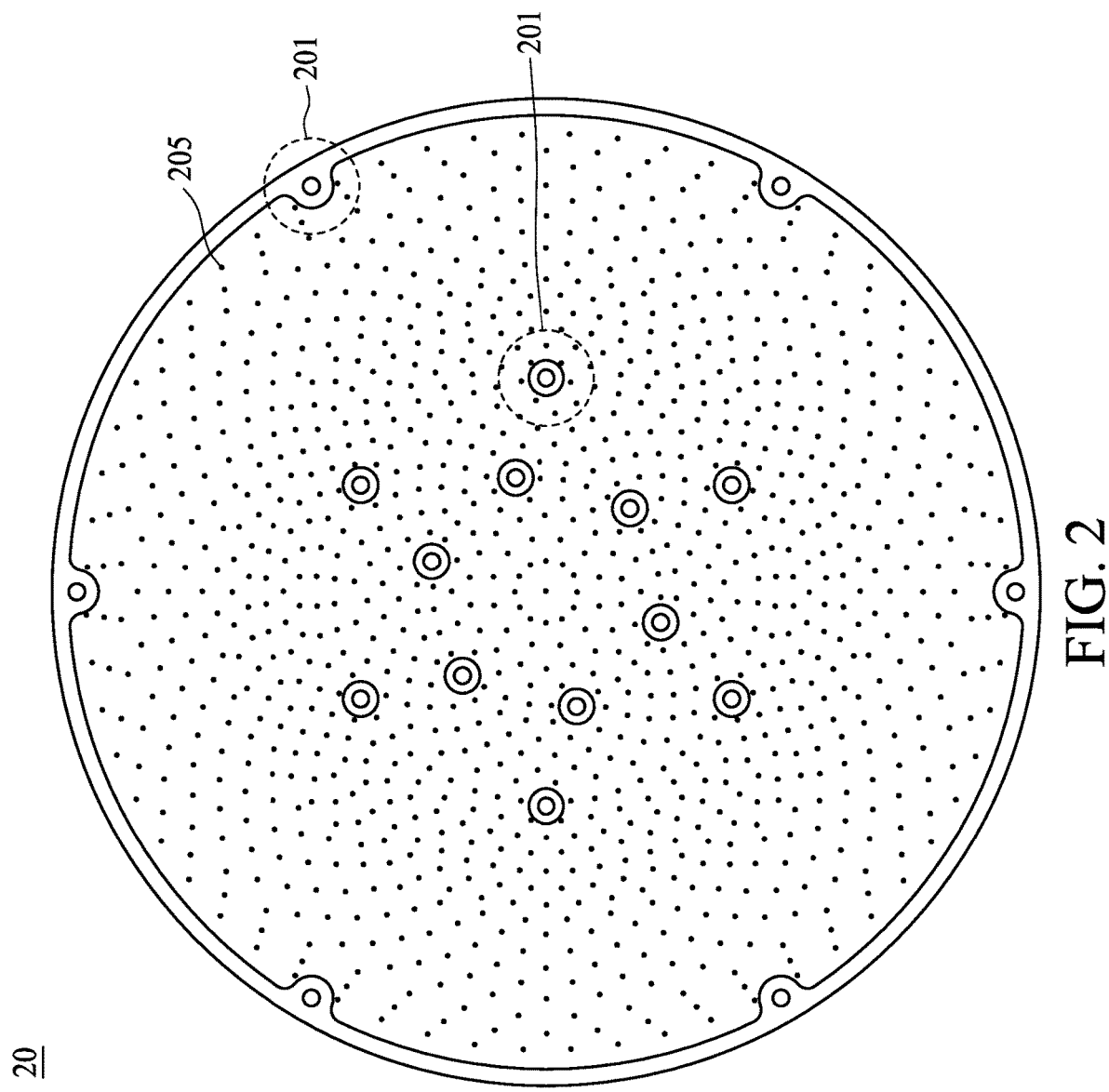
FIG. 2 is a top view of a blocker plate for the CVD apparatus, in accordance with some embodiments of the present disclosure.

Referring to FIG. 2, FIG. 2 is a top view of a blocker plate 20 for the CVD apparatus 10, in accordance with some embodiments of the present disclosure. The blocker plate 20 can be in circular shape and having an outer ring implemented with several fixture mechanism 201. In some embodiments, the fixture mechanism 201 can also be positioned near a center of the blocker plate 20. The fixture mechanism 201 can be a through hole with a hole size matching with a corresponding screw. The blocker plate can be adjustably fixed to a position of the process chamber 102 so as to achieve the desired process gas flow and pressure differential across the showerhead 108. A plurality of gas passages 205, or through holes, as will be later used in present disclosure, distributed across the blocker plate 20. With preferred arrangement of said plurality of gas passages 205, a desirable process gas flow and pressure differential can be achieved and rendering uniform film thickness across the underlying substrate 106. The arrangement of said plurality of gas passages 205 will be further described in FIG. 3 to FIG. 14 of present disclosure.

Figure 3:
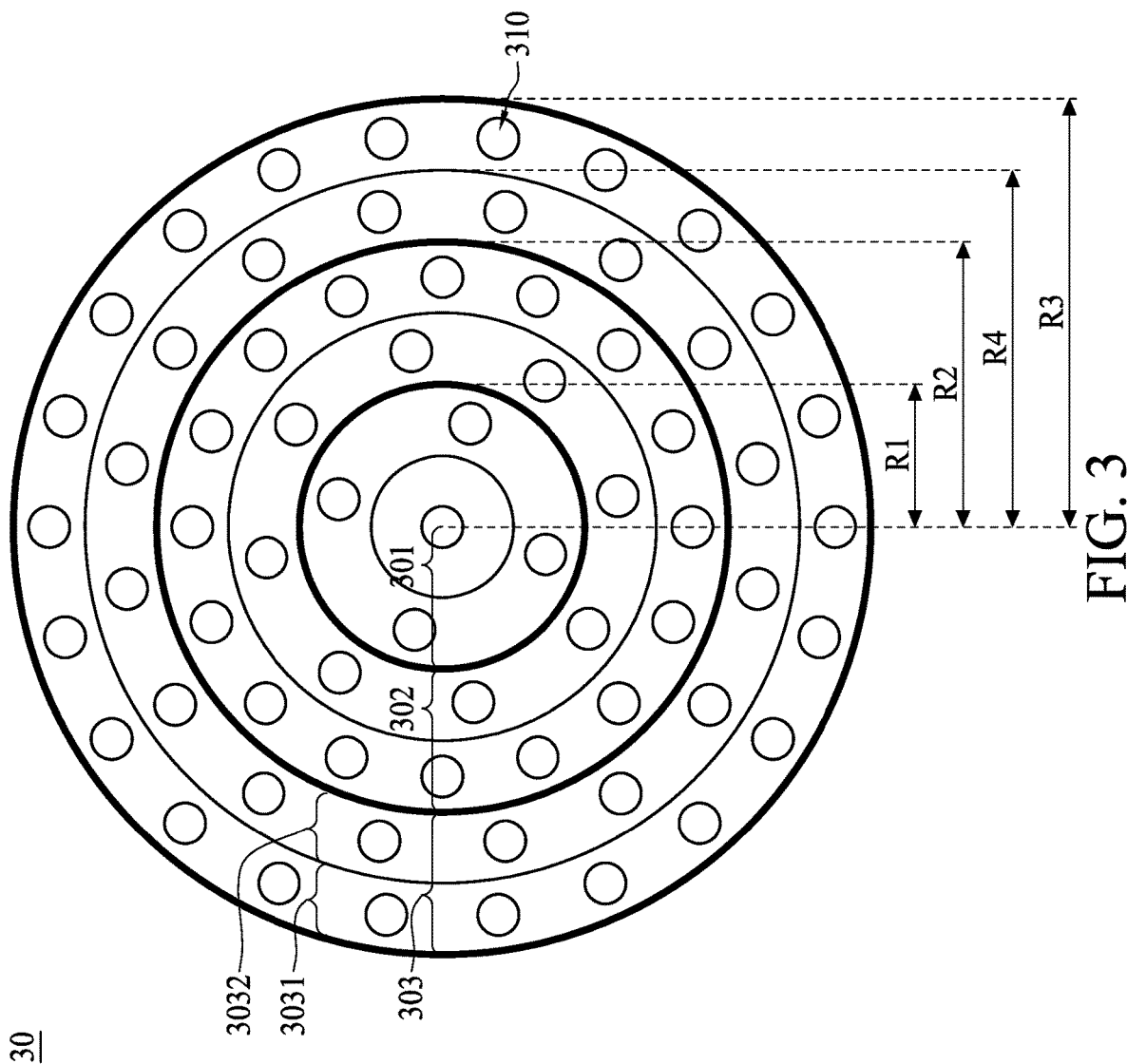
FIG. 3 is a top view of a blocker plate for the CVD apparatus, in accordance with some embodiments of the present disclosure.

Referring to FIG. 3, FIG. 3 is a top view of a blocker plate 30 for the CVD apparatus 10, in accordance with some embodiments of the present disclosure. The blocker plate 30 includes a plate body with an upstream surface and a downstream surface on the opposite side of the upstream surface. The upstream surface is configured to face the backing plate 120 when installed the blocker plate 30 in the CVD apparatus 10, and the downstream surface is configured to face the showerhead 108 when installed the blocker plate 30 in the CVD apparatus 10. FIG. 3 can either be an upstream surface or a downstream surface of the blocker plate 30.

Three zones can be identified on the upstream or downstream surface of the blocker plate 30 along a radial direction of the plate body. As shown in FIG. 3, a first zone 301 is a circular region spanning from a center of the plate body to a first radius R1 of the plate body, as will be individually illustrated and discussed in FIG. 4. A second zone 302 is a belt region spanning from the first radius R1 of the plate body to a second radius R2 of the plate body, as will be individually illustrated and discussed in FIG. 5. A third zone 303 is a belt region spanning from the second radius R2 of the plate body to a third radius R3 of the plate body, as will be individually illustrated and discussed in FIG. 6. In some embodiments, the blocker plate 30 has a radius of 160 millimeter. The third radius R3 may correspond to the radius of the blocker plate 30. In some embodiments, the first radius R1 is smaller than 40% of the third radius R3. For example, if the third radius R3 is about 160 millimeter, the corresponding first radius R1 is about 60 millimeter. In some embodiments, the second radius R2 is smaller than 65% of the third radius R3. For example, if the third radius R3 is about 160 millimeter, the corresponding second radius R2 is about 100 millimeter. A fourth radius R4 is located in the third zone 303 and being positioned between the second radius R2 and the third radius. An outer portion 3031 of the third zone 303 is separated from an inner portion 3032 of the third zone 303 by a circle defined by the fourth radius R4. In some embodiments, the fourth radius R4 is smaller than 82% of the third radius R3. For example, if the third radius R3 is about 160 millimeter, the corresponding fourth radius R4 is about 130 millimeter.

A number of through holes 310 are arranged in the first zone 301, the second zone 302, and the third zone 303 on the blocker plate 30, as illustrated in FIG. 3. Through holes 310 of FIG. 3 are not drew to scale. Relative dimension of the through holes 310 to the blocker plate 30 and the exact number of the through holes 310 are only for illustration purpose.

Figure 4:
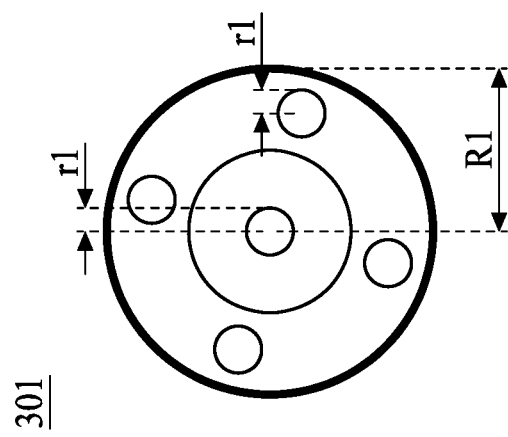
FIG. 4 is a top view of a first zone of a blocker plate of FIG. 3, in accordance with some embodiments of the present disclosure.

Referring to FIG. 4, FIG. 4 is a top view of a first zone 301 of the blocker plate 30 of FIG. 3, in accordance with some embodiments of the present disclosure. The first zone 301 of the blocker plate 30 has a first through hole density $\rho1$, which is the number of through holes per unit area. For example, the first through hole density $\rho1$ can be calculated by Equation 1 below, $$\rho1 = N_{301}/(\pi * R1^2) \quad [\text{Eq. 1A}]$$

wherein $N_{301}$ is a total number of the through holes in the first zone 301, and the denominator is an area of the first zone 301. In addition, the first zone 301 has a first conductance $y1$, which is a normalized value of the conductance $Y1$ in the first zone 301 with respect to an average of a total conductance $Y$. The total conductance $Y$ is the summation of the conductance $Y1$ in the first zone 301, the conductance $Y2$ in the second zone 302, and the conductance $Y3$ in the third zone 303. For example, the first conductance $y1$ can be calculated by Equation 1B below, $$y1 = (\pi * r1^2 * \rho1)/(Y/3) \quad [\text{Eq. 1B}]$$

where $r1$ is a radius of each through hole in the first zone 301. In present disclosure, the radius of the through hole can be referred to an aperture of the through hole. The numerator is an area of each through hole in first zone multiplied by the first through hole density $\rho1$, and the denominator is an average of the total conductance $Y$, assuming the blocker plate 30 has been separated into three zones. In FIG. 4, each of the through hole in the first zone 301 has substantially identical radius $r1$.

Figure 5:
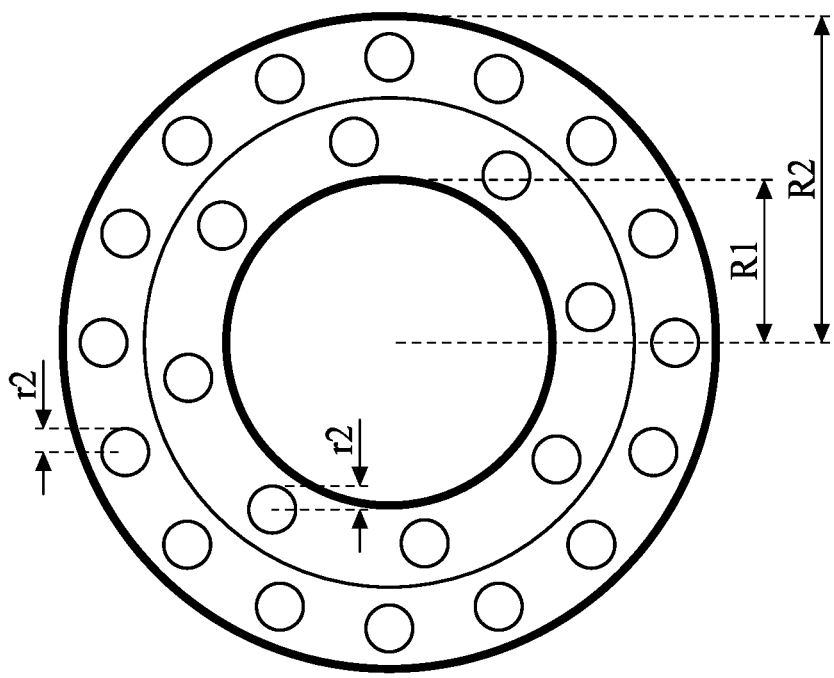
FIG. 5 is a top view of a second zone of a blocker plate of FIG. 3, in accordance with some embodiments of the present disclosure.

Referring to FIG. 5, FIG. 5 is a top view of a second zone 302 of the blocker plate 30 of FIG. 3, in accordance with some embodiments of the present disclosure. Similarly, the second zone 302 of the blocker plate 30 has a second through hole density $\rho2$, which is the number of through holes per unit area. For example, the second through hole density ρ2 can be calculated by Equation 2A below, $$\rho 2 = N_{302}/(\pi*(R2^2 - R1^2)) \quad [\text{Eq. 2A}]$$

wherein $N_{302}$ is total number of the through holes in the second zone 302, and the denominator is an area of the second zone 302. In addition, the second zone 302 has a second conductance y2, which is a normalized value of the conductance Y2 in the second zone 302 with respect to an average of a total conductance Y. The total conductance Y is the summation of the conductance Y1 in the first zone 301, the conductance Y2 in the second zone 302, and the conductance Y3 in the third zone 303. For example, the second conductance y2 can be calculated by Equation 2B below, $$y2 = (\pi*r2^2*\rho 2)/(Y/3) \quad [\text{Eq. 2B}]$$

where r2 is a radius of each through hole in the second zone 302. The numerator is an area of each through hole in the second zone 302 multiplied by the second through hole density ρ2, and the denominator is an average of the total conductance Y, assuming the blocker plate 30 has been separated into three zones. In FIG. 5, each of the through hole in the second zone 302 has substantially identical radius r2. In some embodiments, radius r2 of the through hole in the second zone 302 is substantially identical to radius r1 of the through hole in the first zone 301.

Figure 6:
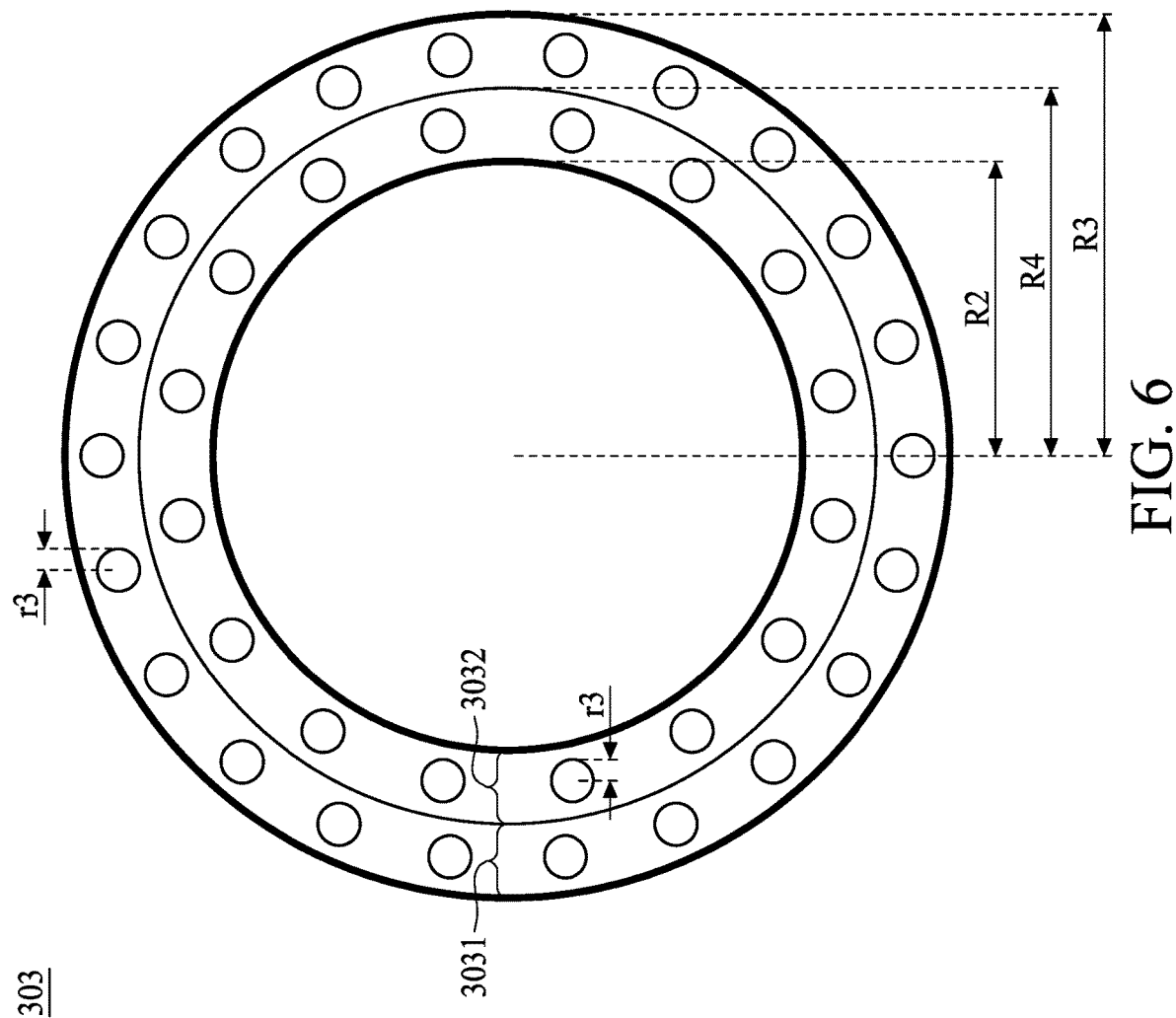
FIG. 6 is a top view of a third zone of a blocker plate of FIG. 3, in accordance with some embodiments of the present disclosure.

Referring to FIG. 6, FIG. 6 is a top view of a third zone 303 of the blocker plate 30 of FIG. 3, in accordance with some embodiments of the present disclosure. Similarly, the third zone 303 of the blocker plate 30 has a third through hole density ρ3, which is the number of through holes per unit area. For example, the third through hole density ρ3 can be calculated by Equation 3A below, $$\rho 3 = N_{303}/(\pi*(R3^2 - R2^2)) \quad [\text{Eq. 3A}]$$

wherein $N_{303}$ is total number of the through holes in the third zone 303, and the denominator is an area of the third zone 303. In addition, the third zone 303 has a third conductance y3, which is a normalized value of the conductance Y3 in the third zone 303 with respect to an average of a total conductance Y. The total conductance Y is the summation of the conductance Y1 in the first zone 301, the conductance Y2 in the second zone 302, and the conductance Y3 in the third zone 303. For example, the third conductance y3 can be calculated by Equation 3B below, $$y3 = (\pi*r3^2*\rho 3)/(Y/3) \quad [\text{Eq. 3B}]$$

where r3 is a radius of each through hole in the third zone 303. The numerator is an area of each through hole in s the third zone 303 multiplied by the third through hole density ρ3, and the denominator is an average of the total conductance Y, assuming the blocker plate 30 has been separated into three zones. In FIG. 6, each of the through hole in the third zone 303 has substantially identical radius r3.

Figure 12:
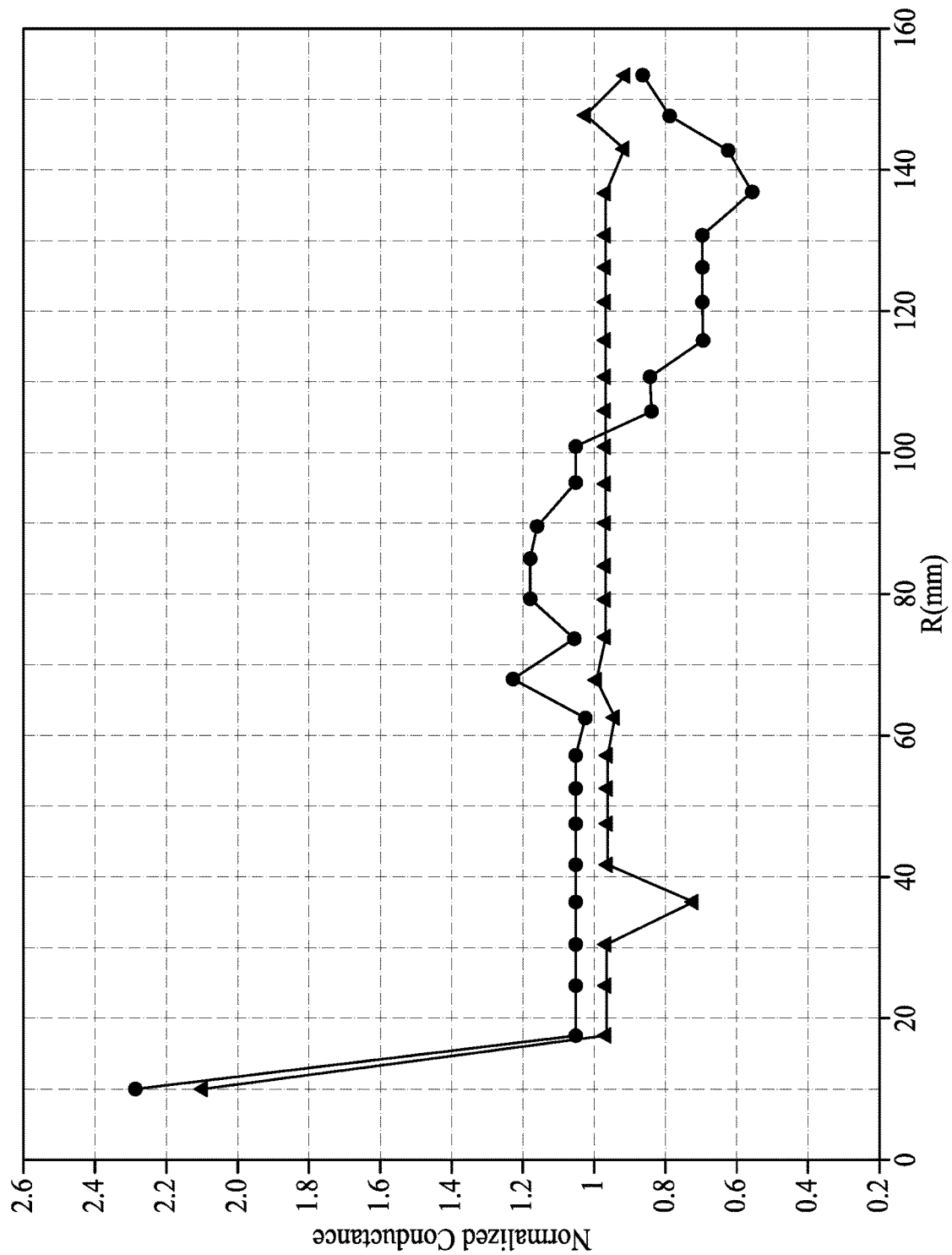
FIG. 12 is a diagram showing gas conductance corresponding to different radial positions on a semiconductor wafer, in accordance with some embodiments of the present disclosure.

Referring to FIG. 12, FIG. 12 is a diagram showing normalized gas conductance (Y axis) corresponding to different radial positions on a semiconductor wafer (X axis), in accordance with some embodiments of the present disclosure. Two sets of data are plotted in FIG. 12, the one shown in solid triangles is a conventional blocker plate of a comparative embodiment, and the other one shown in solid circles is a blocker plate of embodiment of present disclosure. It is shown that in the conventional blocker plate (i.e., solid triangles), the normalized conductance, as previously defined in present disclosure, remains constant across the first zone (e.g., from semiconductor wafer center to a first radius of about 60 mm), the second zone (e.g., from a first radius of about 60 mm to a second radius of about 100 mm), and a third zone (e.g., from a second radius of about 100 mm to a third radius of about 160 mm).

It is shown that in the blocker plate of present disclosure (i.e., solid circles), the normalized conductance remains constant across the first zone, but being non-uniform in the second zone and the third zone. For example, the normalized conductance of the blocker plate of present disclosure has a greater normalized conductance in the second zone than in the first zone or in the third zone. For example, the normalized conductance of the blocker plate of present disclosure has a greater normalized conductance in the first zone than in the third zone. Note that in the third zone, an outer portion between a fourth radius of about 130 mm to the third radius of about 160 mm shows a monotonically increase of the normalized conductance. In some comparative embodiments, flow speed of the process gas at an edge of the wafer is comparatively greater than that at a center of the wafer and causing a thinner film thickness deposited at the edge of the wafer than at the center. In some embodiments, normalized conductance is thereby designed to monotonically increase from the fourth radius of about 130 mm to the third radius of about 160 mm in order to resolve the aforesaid flow speed difference.

As shown in FIG. 12, the normalized conductance (i.e., solid circles) of current blocker plate in the third zone is designed to be lower than that (i.e., solid diamonds) of the comparative blocker plate. In order to compensate the flow rate difference between the center and the edge of the wafer, normalized conductance (i.e., solid circles) of current blocker plate is designed to increase from the midway (e.g., 130 mm) to the edge (e.g., 160 mm) of the third zone. Referring back to FIG. 10, the fourth radius R23 is at least equal to or smaller than 82% of the third radius R3. In some embodiments, a summation of the normalized conductance in the first zone and in the second zone is about 1 to 2 times greater than the normalized conductance in the third zone.

The blocker plate of present disclosure demonstrating such normalized conductance distribution can achieve better film thickness uniformity over the substrate placed in a CVD apparatus, as will be discussed in FIG. 13.

Figure 13:
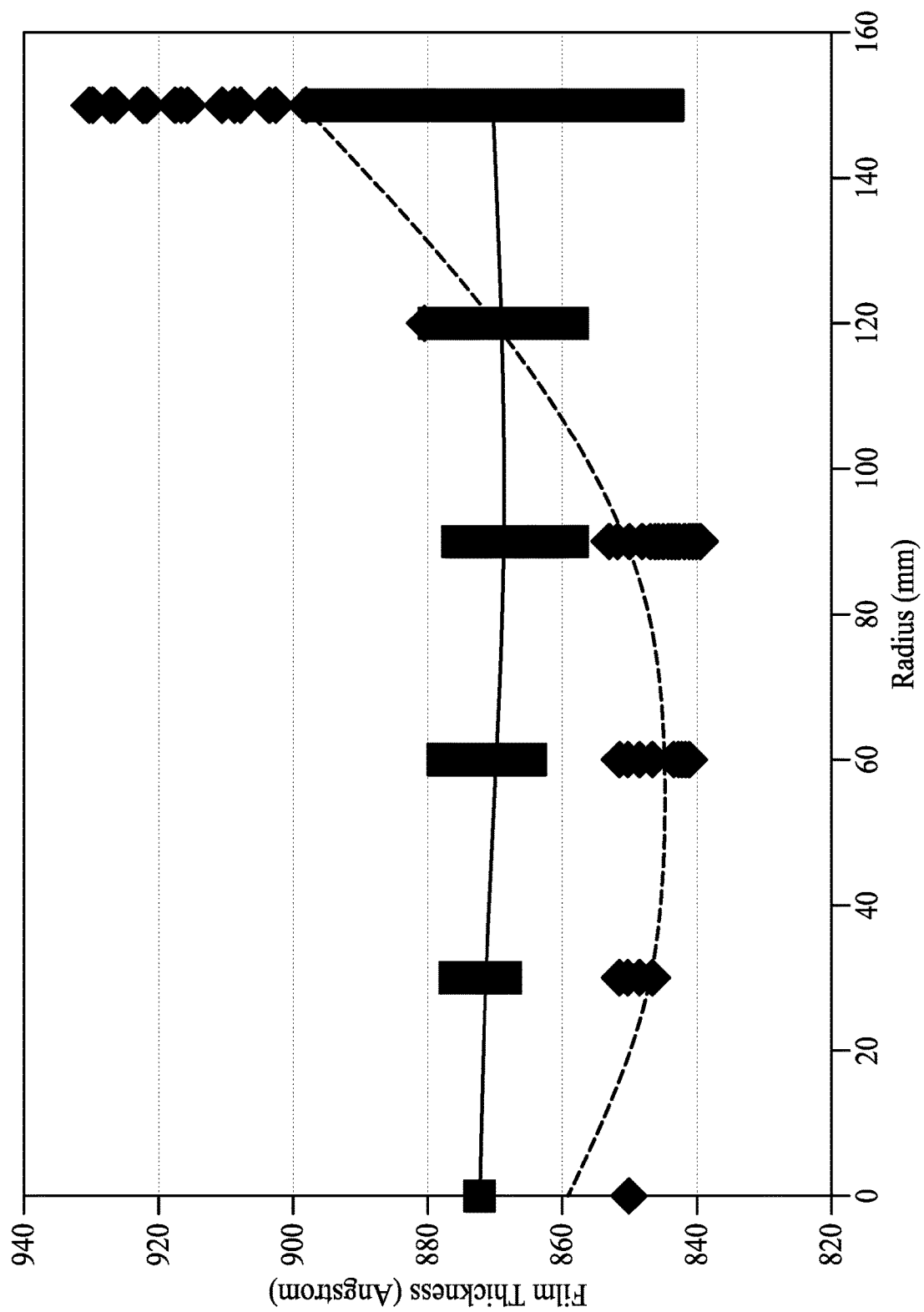
FIG. 13 is a diagram showing film thickness corresponding to different radial positions on a semiconductor wafer, in accordance with some embodiments and comparative embodiments of the present disclosure.

Referring to FIG. 13, FIG. 13 is a diagram showing film thickness (Y axis) corresponding to different radial positions on a semiconductor wafer (X axis), in accordance with some embodiments and comparative embodiments of the present disclosure. Two sets of data are plotted in FIG. 13, the one shown in solid diamonds is a conventional blocker plate of a comparative embodiment, and the other one shown in solid squares is a blocker plate of embodiment of present disclosure. It is shown that in the conventional blocker plate (i.e., solid diamonds), film thickness varies drastically across the first zone (e.g., from semiconductor wafer center to a first radius of about 60 mm), the second zone (e.g., from a first radius of about 60 mm to a second radius of about 100 mm), and a third zone (e.g., from a second radius of about 100 mm to a third radius of about 160 mm). Solid line connecting solid diamonds shows that the deposited film has a thinnest portion of about 845 Angstrom situated at around 60 mm and thickest portion of about 895 Angstrom situated proximal to wafer edge (e.g., around 150 mm).

It is shown that in the blocker plate of present disclosure (i.e., solid squares), film thickness remains constant across the first zone, the second zone, and the third zone. Solid line connecting solid squares shows that the deposited film has a substantially even film thickness of about 875 Angstrom throughout the wafer. Therefore, the non-uniform normalized conductance demonstrated in FIG. 16 improves the film thickness uniformity under the CVD apparatus setting as previously discussed.

Referring back to FIG. 3, in some embodiments, radius r3 of the through hole in the third zone 303 is substantially identical to both radius r1 of the through hole in the first zone 301 and radius r2 of the through hole in the second zone 302. To achieve the non-uniform normalized conductance demonstrated in FIG. 12, in some embodiments, the second through hole density ρ2 is greater than the first through hole density ρ1. In some embodiments, the second through hole density ρ2 is greater than the third through hole density ρ3. In some embodiments, the first through hole density ρ1 is greater than the third through hole density ρ3. In some embodiments, the through hole density monotonically increases from the fourth radius R4 to the third radius R3 defining the outer portion 3032 of the third zone 303.

To achieve the non-uniform normalized conductance demonstrated in FIG. 12, in some embodiments, the blocker plate 30 may possess a ratio of the number of through holes in the first zone 301 and the number of through holes in the second zone 302 is in a range of from about 0.45 to about 0.55. The blocker plate 30 may possess a ratio of the number of through holes in the second zone 302 and the number of through holes in the third zone 303 is in a range of from about 0.6 to about 0.8. The blocker plate 30 may possess a ratio of the number of through holes in the first zone 301 and the number of through holes in the third zone 303 is in a range of from about 0.3 to about 0.4.

Figure 7:
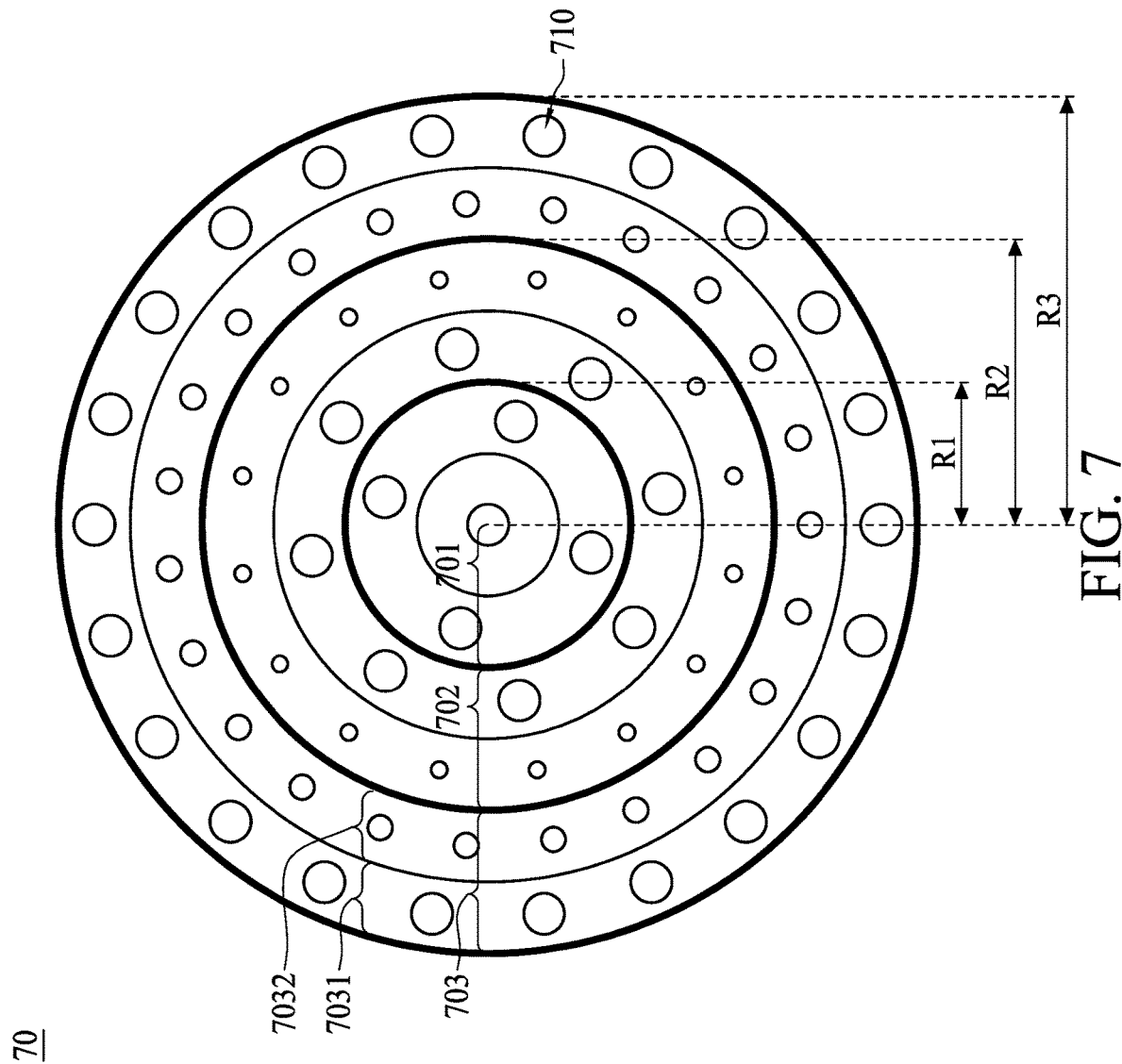
FIG. 7 is a top view of a blocker plate for the CVD apparatus, in accordance with some embodiments of the present disclosure.

Referring to FIG. 7, FIG. 7 is a top view of a blocker plate 70 for the CVD apparatus 10, in accordance with some embodiments of the present disclosure. The blocker plate 70 includes a plate body with an upstream surface and a downstream surface on the opposite side of the upstream surface. The upstream surface is configured to face the backing plate 120 when installed the blocker plate 70 in the CVD apparatus 10, and the downstream surface is configured to face the showerhead 108 when installed the blocker plate 70 in the CVD apparatus 10. FIG. 7 can either be an upstream surface or a downstream surface of the blocker plate 70.

Three zones can be identified on the upstream or downstream surface of the blocker plate 70 along a radial direction of the plate body. As shown in FIG. 7, a first zone 701 is a circular region spanning from a center of the plate body to a first radius R1 of the plate body, as will be individually illustrated and discussed in FIG. 8. A second zone 702 is a belt region spanning from the first radius R1 of the plate body to a second radius R2 of the plate body, as will be individually illustrated and discussed in FIG. 9. A third zone 703 is a belt region spanning from the second radius R2 of the plate body to a third radius R3 of the plate body, as will be individually illustrated and discussed in FIG. 10. In some embodiments, the blocker plate 70 has a radius of 160 millimeter. The third radius R3 may correspond to the radius of the blocker plate 70.

A fourth radius R23 is located in the third zone 703 and being positioned between the second radius R2 and the third radius. An outer portion 7031 of the third zone 303 is separated from an inner portion 7032 of the third zone 703 by a circle defined by the fourth radius R23. In some embodiments, the fourth radius R23 is smaller than 82% of the third radius R3. For example, if the third radius R3 is about 160 millimeter, the corresponding fourth radius R23 is about 130 millimeter.

A number of through holes 710 are arranged in the first zone 701, the second zone 702, and the third zone 703 on the blocker plate 70, as illustrated in FIG. 7. Through holes 710 of FIG. 7 are not drew to scale. Relative dimension of the through holes 710 to the blocker plate 70 and the exact number of the through holes 710 are only for illustration purpose.

Figure 8:
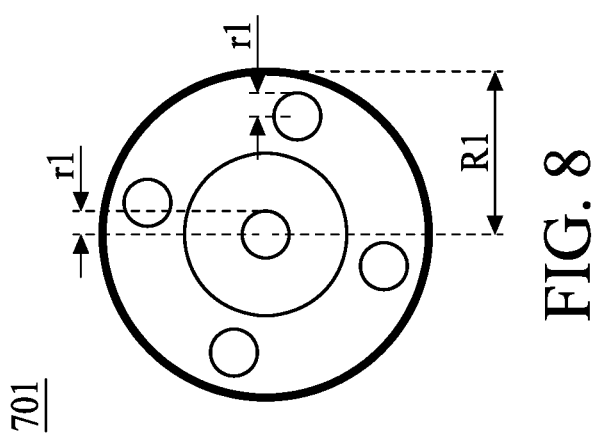
FIG. 8 is a top view of a first zone of a blocker plate of FIG. 7, in accordance with some embodiments of the present disclosure.

Referring to FIG. 8, FIG. 8 is a top view of a first zone 701 of a blocker plate 70 of FIG. 7, in accordance with some embodiments of the present disclosure. The first zone 701 of the blocker plate 70 has a first through hole density ρ1, which is the number of through holes per unit area. For example, the first through hole density ρ1 can be calculated by Equation 4A below, $$\rho 1 = N_{701}/(\pi * R1^2)$$ [Eq. 4A]

, wherein $N_{701}$ is a total number of the through holes in the first zone 701, and the denominator is an area of the first zone 701. In addition, the first zone 701 has a first conductance y1, which is a normalized value of the conductance Y1 in the first zone 701 with respect to an average of a total conductance Y. The total conductance Y is the summation of the conductance Y1 in the first zone 701, the conductance Y2 in the second zone 702, and the conductance Y3 in the third zone 703. For example, the first conductance y1 can be calculated by Equation 4B below, $$y1 = (\pi * r1^2 * \rho 1)/(Y/3)$$ [Eq. 4B]

where r1 is a radius of each through hole in the first zone 701. The numerator is an area of each through hole in first zone multiplied by the first through hole density ρ1, and the denominator is an average of the total conductance Y, assuming the blocker plate 70 has been separated into three zones. In FIG. 8, each of the through hole in the first zone 701 has substantially identical radius r1.

Figure 9:
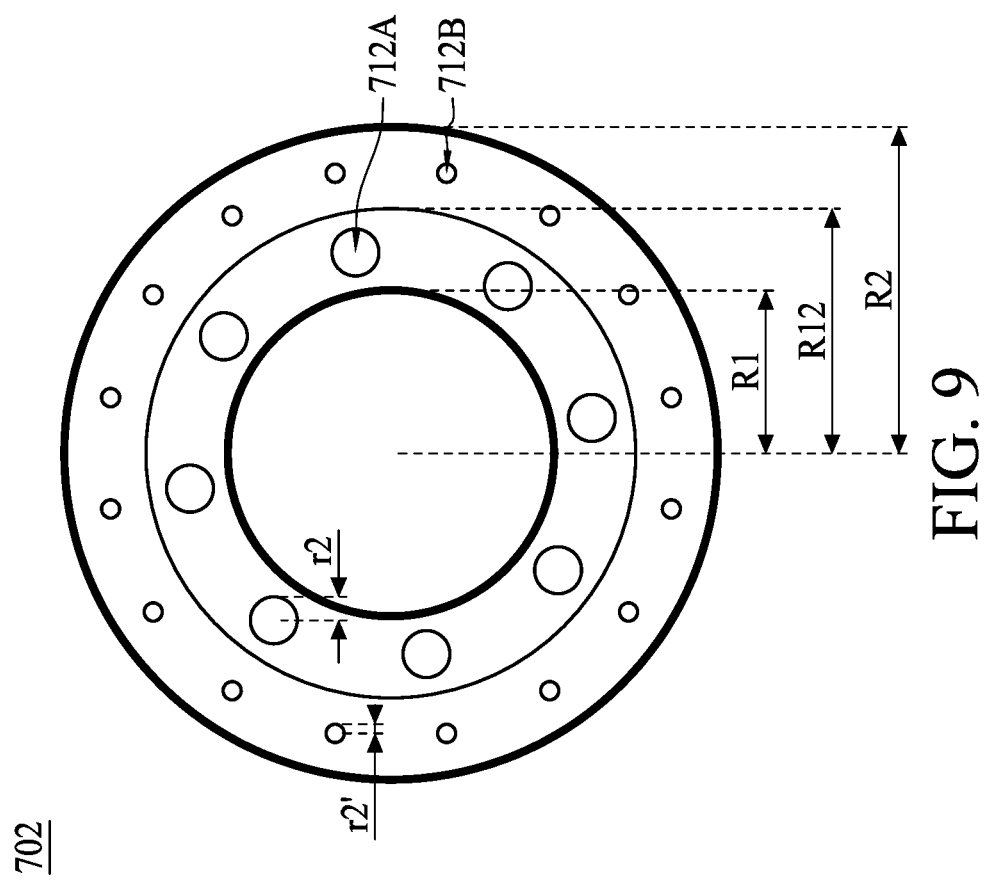
FIG. 9 is a top view of a second zone of a blocker plate of FIG. 7, in accordance with some embodiments of the present disclosure.

Referring to FIG. 9, FIG. 9 is a top view of a second zone 702 of a blocker plate 70 of FIG. 7, in accordance with some embodiments of the present disclosure. As shown in FIG. 9, through holes with different radii are positioned in the second zone 702. For example, through holes 712A in the belt region defined by the first radius R1 and the fifth radius R12 are having substantially identical radii. On the other hand, through holes 712B in the belt region defined by fifth radius R12 and the second radius R2 are having substantially identical radii. The second zone 702 of the blocker plate 70 has two second through hole densities ρ2' and ρ2" defined by different through hole radii. Each of the second through hole densities is the number of through holes of same radius per unit area. For example, the second through hole densities ρ2' and ρ2" can be calculated by Equation 5A and Equation 5B below, $$\rho 2' = N_{702,r2}/(\pi * (R12^2 - R1^2))$$ [Eq. 5A]

$$\rho 2'' = N_{702,r2}/(\pi * (R2^2 - R12^2))$$ [Eq. 5B]

wherein $N_{702,r2}$ is total number of the through holes having a radius of r2 in the second zone 702, and $N_{702,r2'}$ is total number of the through holes having a radius of r2' in the second zone 702. The denominator is the corresponding belt region in the second zone 702. In addition, the second zone 702 has two second conductance y2' and y2", calculated by different through hole radii. The two second conductance y2' and y2" are normalized values of the conductance Y2 in the second zone 702 with respect to an average of a total conductance Y. The total conductance Y is the summation of the conductance Y1 in the first zone 701, the conductance Y2 in the second zone 702, and the conductance Y3 in the third zone 703. For example, the two second conductance y2' and y2" can be calculated by Equation 5C and Equation 5D below, $$y2'=(\pi*r2^{2}*\rho2')/(Y/3) \quad \text{[Eq. 5C]}$$

$$y2''=(\pi*r2'^{2}*\rho2'')/(Y/3) \quad \text{[Eq. 5D]}$$

where the numerator is an area of each through hole having identical radius in the second zone 702 multiplied by the corresponding second through hole densities $\rho2'$ and $\rho2''$. The denominator is an average of the total conductance Y, assuming the blocker plate 70 has been separated into three zones. The summation of the two second conductance y2' and y2" constitutes the normalized conductance in the second zone 702. In some embodiments, the radius r2 of the through hole 712A is different from the radius r2' of the through hole 712B. In some embodiments, the radius r2 of the through hole 712A is greater than the radius r2' of the through hole 712B. In some embodiments, the radius r2 of the through hole 712A is smaller than the radius r2' of the through hole 712B.

Although not illustrated in present disclosure, through holes in the belt region defined by the first radius R1 and the fifth radius R12 can have different radii, and through holes in the belt region defined by fifth radius R12 and the second radius R2 can have different radii, as long as the normalized conductance in each zones correspond to the non-uniform distribution as previously discussed in FIG. 16.

Figure 10:
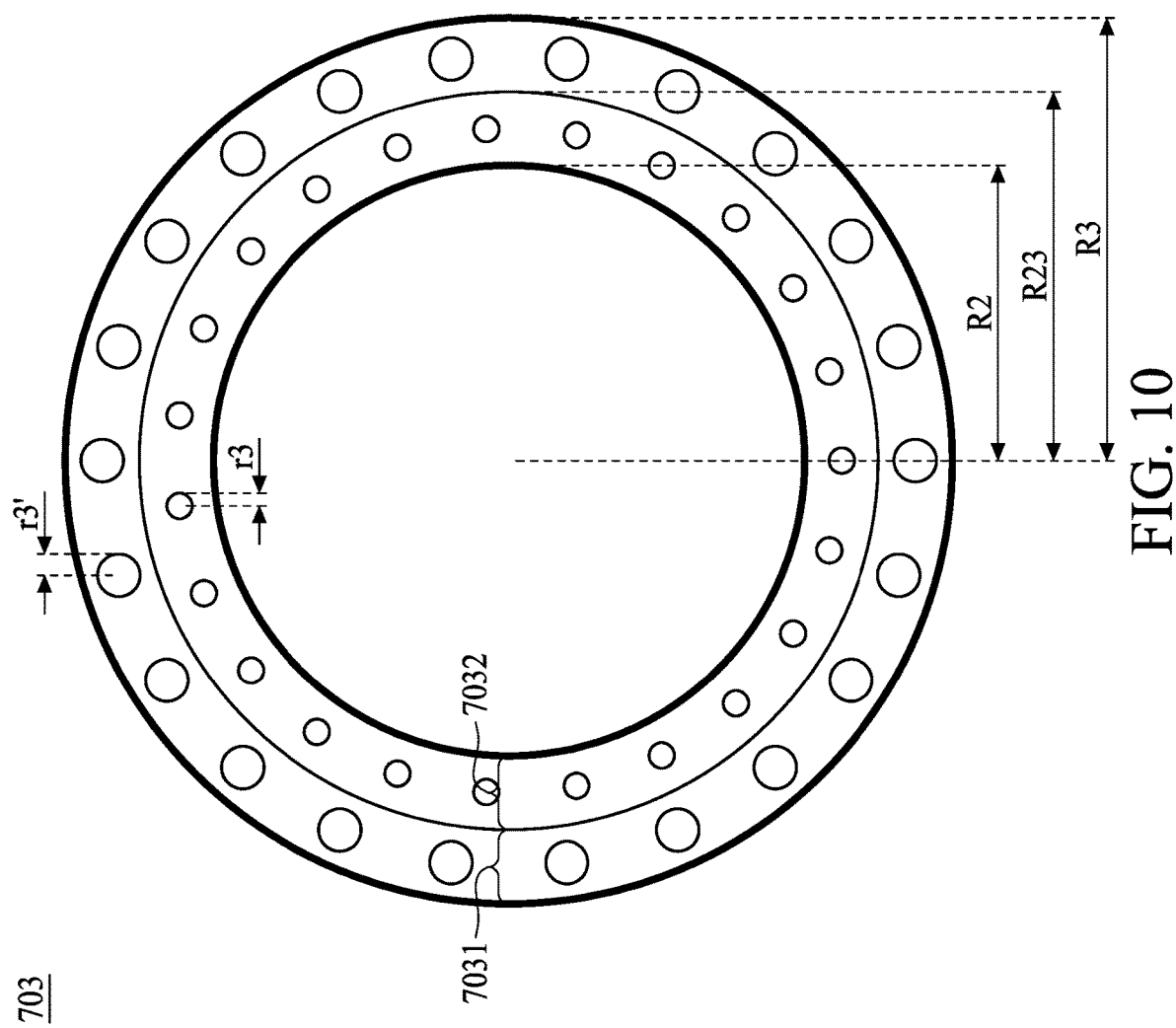
FIG. 10 is a top view of a third zone of a blocker plate of FIG. 7, in accordance with some embodiments of the present disclosure.

Referring to FIG. 10, FIG. 10 is a top view of a third zone 703 of a blocker plate 70 of FIG. 7, in accordance with some embodiments of the present disclosure. FIG. 10 is a top view of a third zone 703 of a blocker plate 70 of FIG. 7, in accordance with some embodiments of the present disclosure. As shown in FIG. 10, through holes with different radii are positioned in the third zone 703. For example, through holes 713A in the belt region defined by the second radius R2 and the fourth radius R23 are having substantially identical radii. On the other hand, through holes 713B in the belt region defined by fourth radius R23 and the third radius R3 are having substantially identical radii. The third zone 703 of the blocker plate 70 has two third through hole densities $\rho3'$ and $\rho3''$ defined by different through hole radii. Each of the third through hole densities is the number of through holes of same radius per unit area. For example, third through hole densities $\rho3'$ and $\rho3''$ can be calculated by Equation 6A and Equation 6B below, $$\rho3'=N_{703,r3}/(\pi*(R23^2-R2^2)) \quad \text{[Eq. 6A]}$$

$$\rho3''=N_{703,r3}/(\pi*(R3^2-R23^2)) \quad \text{[Eq. 6B]}$$

wherein $N_{703,r3}$ is a total number of the through holes having a radius of r3 in the third zone 703, and $N_{703,r3'}$ is a total number of the through holes having a radius of r3' in the third zone 703. The denominator is the corresponding belt region in the third zone 703. In addition, the third zone 703 has two third conductance y3' and y3", calculated by different through hole radii. The two third conductance y3' and y3" are normalized values of the conductance Y3 in the third zone 703 with respect to an average of a total conductance Y. The total conductance Y is the summation of the conductance Y1 in the first zone 701, the conductance Y2 in the second zone 702, and the conductance Y3 in the third zone 703. For example, the two third conductance y3' and y3" can be calculated by Equation 6C and Equation 6D below, $$y3'=(\pi*r3^{2}*\rho3')/(Y/3) \quad \text{[Eq. 6C]}$$

$$y3''=(\pi*r3'^{2}*\rho3'')/(Y/3) \quad \text{[Eq. 6D]}$$

where the numerator is an area of each through hole having identical radius in the third zone 703 multiplied by the corresponding third through hole densities $\rho3'$ and $\rho3''$. The denominator is an average of the total conductance Y, assuming the blocker plate 70 has been separated into three zones. The summation of the two third conductance y3' and y3" constitutes the normalized conductance in the third zone 703. In some embodiments, the radius r3 of the through hole 713A is different from the radius r3' of the through hole 713B. In some embodiments, the radius r3 of the through hole 713A is greater than the radius r3' of the through hole 713B. In some embodiments, the radius r3 of the through hole 713A is smaller than the radius r3' of the through hole 713B.

Although not illustrated in present disclosure, through holes in the belt region defined by the first radius R2 and the fourth radius R23 can have different radii, and through holes in the belt region defined by fourth radius R23 and the third radius R3 can have different radii, as long as the normalized conductance in each zones correspond to the non-uniform distribution as previously discussed in FIG. 12.

To achieve the non-uniform normalized conductance demonstrated in FIG. 12, in some embodiments, the summation of the two second conductance y2' and y2" is greater than the summation of the first conductance y1, as previously addressed in FIG. 8 and FIG. 9. In some embodiments, the first conductance y1 is greater than the summation of the two third conductance y3' and y3", as previously addressed in FIG. 8 and FIG. 10. In some embodiments, the summation of the two second conductance y2' and y2" is greater than the summation of the two third conductance y3' and y3", as previously addressed in FIG. 9 and FIG. 10. In some embodiments, a summation of the first conductance y1 and two second conductance y2', y2" is greater than 2 times of the summation of the two third conductance y3' and y3". In some embodiments, the third conductance y3" monotonically increases from the fourth radius R23 to the third radius R3 defining the outer portion 7031 of the third zone 703.

The radius and number of the through hole can be determined based on the boundary conditions that the conductance in each zone follows the non-uniform distribution as shown in FIG. 12.

Some embodiments of the present disclosure provide a blocker plate, including a plate body having a plurality of through holes, a first zone from a center to a first radius of the plate body, having a first through hole density, a second zone from the first radius to a second radius of the plate body, having a second through hole density, a third zone from the second radius to a third radius of the plate body, having a third through hole density, wherein the first radius is smaller than the second radius, the second radius is smaller than the third radius, and the second through hole density is greater than the first through hole density.

Some embodiments of the present disclosure provide a blocker plate, including a plate body having a plurality of through holes, a first zone from a center to a first radius of the plate body, having a first conductance, a second zone from the first radius to a second radius of the plate body, having a second conductance, a third zone from the second radius to a third radius of the plate body, having a third conductance, wherein the first radius is smaller than the second radius, the second radius is smaller than the third radius, and the second conductance is greater than the first conductance.

Some embodiments of the present disclosure provide a chemical vapor deposition (CVD) apparatus, including a substrate holder in the chamber, a shower head over the substrate holder, and a blocker plate over the shower head. A distance between the shower head and the substrate holder is 6 to 8.5 times a distance between the blocker plate to the shower head. The blocker plate includes a first zone from a center to a first radius, having a first conductance, a second zone from the first radius to a second radius, having a second conductance, and a third zone from the second radius to a third radius, having a third conductance, the first conductance being greater than the third conductance and smaller than the second conductance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A processing apparatus, comprising:
   a blocker plate having an upstream surface and a downstream surface opposite to the upstream surface, the blocker plate comprises;
      a plate body having a plurality of through holes;
      a first zone from a center to a first radius of the plate body, having a first through hole density;
      a second zone from the first radius to a second radius of the plate body, having a second through hole density;
      a third zone from the second radius to a third radius of the plate body, having a third through hole density, wherein the first radius is smaller than the second radius, the second radius is smaller than the third radius, the first radius is less than 40% of the third radius, the second radius is less than 65% of the third radius, the third zone is an outermost zone, the second through hole density is greater than the first through hole density, the second through hole density is greater than the third through hole density, and a through hole in the second zone has a first aperture different from a second aperture of a through hole in the first zone; and
   a shower head, wherein a top surface of the shower head faces the downstream surface of the blocker plate.

2. The processing apparatus of claim 1, wherein the first through hole density is greater than the third through hole density.

3. The processing apparatus of claim 1, wherein the third zone further comprises:
   an inner portion from the second radius to a fourth radius of the plate body; and
   an outer portion from the fourth radius to the third radius of the plate body,
   wherein a through hole density in the outer portion monotonically increases from the fourth radius to the third radius, the fourth radius is less than 82% of the third radius.

4. The processing apparatus of claim 1, wherein the inner portion and the outer portion are arranged in concentric circles, and a through hole in the inner portion has a third aperture different from a fourth aperture of a through hole in the outer portion.

5. The processing apparatus of claim 1, wherein a number of through holes in the second zone is about 0.6 to 0.8 time of a number of through holes in the third zone.

6. The processing apparatus of claim 1, wherein the first zone having a first conductance, the second zone having a second conductance, and the third zone having a third conductance, the first conductance being greater than the third conductance.

7. The processing apparatus of claim 6, wherein the second conductance is greater than the third conductance.

8. The processing apparatus of claim 1, wherein a first distance between the shower head and the substrate holder is 6 to 8.5 times a second distance between the blocker plate to the shower head.

9. The processing apparatus of claim 1, wherein the blocker plate and the shower head are disposed in a chamber, a third distance is between the shower head and a bottom of the chamber, a ratio of the first distance to the third distance is in a range from 8.5% to 10%.

10. The processing apparatus of claim 1, further comprising hole between two of the through holes of the blocker plate, wherein the hole is configured to receive a fixture mechanism so that the blocker plate is adjustably fixed to a chamber of the processing apparatus.

11. A processing apparatus, comprising:
   a blocker plate having an upstream surface and a downstream surface opposite to the upstream surface, the blocker plate comprises;
      a plate body having a plurality of through holes;
      a first zone from a center to a first radius of the plate body, having a first conductance;
      a second zone from the first radius to a second radius of the plate body, having a second conductance;
      a third zone from the second radius to a third radius of the plate body, having a third conductance,
      wherein the first radius is smaller than the second radius, the second radius is smaller than the third radius, the first radius is less than 40% of the third radius, and the second radius is less than 65% of the third radius, the third zone is an outermost zone, the second conductance is greater than the first conductance, the first conductance is greater than the third conductance, and a through hole in the second zone has a first aperture different from a second aperture of a through hole in the first zone,
      wherein the third zone further comprises:
         an inner portion from the second radius to a fourth radius of the plate body; and
         an outer portion from the fourth radius to the third radius of the plate body, wherein a conductance in the outer portion monotonically increases from the fourth radius to the third radius, the fourth radius is less than 82% of the third radius; and
   a shower head, wherein a top surface of the shower head faces the downstream surface of the blocker plate.

12. The processing apparatus of claim 11, wherein the second conductance is greater than the third conductance.

13. The processing apparatus of claim 11, wherein a conductance in the first zone and the second zone is less than 2 times of a conductance in the third zone.

14. The processing apparatus of claim 11, wherein the inner portion and the outer portion are arranged in concentric circles, and a through hole in the inner portion has a third aperture different from a fourth aperture of a through hole in the outer portion.

15. A chemical vapor deposition (CVD) apparatus, comprising:
- a substrate holder;
- a shower head over the substrate holder; and
- a blocker plate over the shower head,
- wherein a distance between the shower head and the substrate holder is 6 to 8.5 times a distance between the blocker plate to the shower head, and
- wherein the blocker plate comprises:
  - a first zone from a center to a first radius, having a first conductance;
  - a second zone from the first radius to a second radius, having a second conductance, wherein the second zone comprises an inner portion and an outer portion arranged in concentric circles, and a through hole in the inner portion has a first aperture different from a second aperture of a through hole in the outer portion; and
- a third zone from the second radius to a third radius, having a third conductance, the first conductance being greater than the third conductance and smaller than the second conductance wherein the first radius is less than 40% of the third radius, the second radius is less than 65% of the third radius.

16. The apparatus of claim 15, wherein the blocker plate has a radius of about 160 millimeter.

17. The apparatus of claim 15, wherein the first zone has a first number of through holes, the second zone has a second number of through holes, and the third zone has a third number of through holes, the third number being greater than either the first number or the second number.

18. The apparatus of claim 17, wherein the second number is greater than the first number.

19. The apparatus of claim 15, wherein the blocker plate and the shower head are disposed in a chamber, a separation is between the shower head and a bottom of the chamber, a ratio of the distance between the shower head and the substrate holder to the separation is in a range from 8.5% to 10%.

20. The apparatus of claim 15, wherein the third zone further comprises:
- an inner portion from the second radius to a fourth radius of the plate body; and
- an outer portion from the fourth radius to the third radius of the plate body, wherein a conductance in the outer portion monotonically increases from the fourth radius to the third radius, the fourth radius is less than 82% of the third radius.

* * * * *